United States Patent [19]

Gotoh

[11] Patent Number: 4,899,195
[45] Date of Patent: Feb. 6, 1990

[54] METHOD OF EXPOSING A PERIPHERAL PART OF WAFER

[75] Inventor: Manabu Gotoh, Yokohama, Japan

[73] Assignee: Ushio Denki, Tokyo, Japan

[21] Appl. No.: 287,793

[22] Filed: Dec. 21, 1988

[30] Foreign Application Priority Data

Jan. 29, 1988 [JP] Japan .................................. 63-17286
Sep. 9, 1988 [JP] Japan ................................. 63-224531

[51] Int. Cl.4 ............................................. G03B 27/32
[52] U.S. Cl. ...................................... 355/77; 355/40; 355/53; 355/1
[58] Field of Search .................... 355/1, 39, 40, 43, 53, 355/77, 218

[56]     References Cited
    U.S. PATENT DOCUMENTS

| 3,449,046 | 6/1969 | White ................................ 355/40 X |
| 3,734,612 | 5/1973 | Harvey et al. ........................ 355/40 |
| 3,836,246 | 9/1974 | Bowker ............................. 355/40 X |
| 4,008,954 | 2/1977 | Ogawa et al. ............................ 355/1 |
| 4,477,182 | 10/1984 | Takanashi et al. ................ 355/53 X |

FOREIGN PATENT DOCUMENTS 0123153 10/1984 European Pat. Off. .

OTHER PUBLICATIONS

Patent Abstracts of Japan, vol. 7, No. 256, (P-236) [1401], Nov. 1983.
Patent Abstracts of Japan, vol. 9, No. 193, (E-334) [1916], Aug. 1985.
Patent Abstracts of Japan, vol. 8, No. 268, (E-283) [1705], Dec. 1984.
Patent Abstracts of Japan, vol. 7, No. 190 (E-194) [1335], Aug. 1983.

Primary Examiner—Richard A. Wintercorn
Attorney, Agent, or Firm—Armstrong, Nikaido, Marmelstein, Kubovcik & Murray

[57]     ABSTRACT

A method of exposing a peripheral part of wafer is used for a fine pattern formation process in the processing of ICs, LSIs and other electronics elements, to remove, in a development step, an unncessary portion of a photoresist coated on a semiconductor substrate, typically a silicon wafer, or a substrate consisting of a dielectric, a metal or an insulator, from a peripheral part of the substrate.

In the method for exposing a peripheral part of wafer, the wafer edge is detected using a sensor, and the light emission end of an optical fiber lightguide is controlled to expose a fixed distance from the edge of wafer according to a signal from the sensor. It is thus possible to expose a peripheral part of wafer having a predetermined width with high accuracy. In addition, the wafer centering mechanism and orientation flat detection/positioning mechanism employed in the prior art are unncessary. It is thus possible to provide a method exposing a peripheral part of wafer which can greatly reduce the processing time and has extremely high accuracy and efficiency.

2 Claims, 3 Drawing Sheets

METHOD OF EXPOSING A PERIPHERAL PART OF WAFER

BACKGROUND OF THE INVENTION

1. Field of the Invention

This invention relates to a method of exposing a peripheral part of wafer which is used for a fine pattern formation process in the processing of ICs, LSIs or other electronics elements. More particularly, this invention relates to remove, in a development step, an unnecessary portion of a photoresist coated on a semiconductor substrate, typically a silicon wafer, or a substrate consisting of a dielectric, a metal or an insulator.

2. Description of the Prior Art

In the manufacture of ICs and LSIs, for forming a fine circuit pattern of a photoresist pattern is formed by coating a photoresist on the surface of a silicon wafer or the like and exposing and developing the coated photoresist. The photoresist pattern thus formed is used as a mask to effect ion implantation, etching, lifting-off and other steps.

Usually, the photoresist is coated by spin coating. The spin coating process is disclosed in Japanese Unexamined Patent Publication("KOKAI KOHO" in Japan) 61-79227 and 61-73330. In the spin coating process, the wafer is spun while pouring photoresist onto the center position of the right side of the wafer and the poured photoresist is coated on the right side of the wafer by centrifugal forces. In this spin coating process, however, the photoresist gets off the peripheral part of the wafer and is brought to the wrong side of the wafer.

The photoresist, which is coated on the peripheral part of wafer and brought to the wrong side of the part, is not exposed in a exposing process for forming circuit pattern. Therefore, these photoresists remain unnecessary after development.

The remaining unnecessary photoresist coated on a peripheral part of wafer gives rise to the following problem. The wafer with the photoresist coated is conveyed in various steps and by various systems or units. A peripheral part of wafer thus is sometimes mechanically chucked and sometimes rubs walls of wafer cassette or like wafer accommodation means. In such cases, the unnecessary photoresist portion on the peripheral part of wafer is liable to be removed and re-attached to the pattern formation part of the wafer. In this case, correct pattern formation can no longer be obtained, thus reducing the yield.

The fact that the unnecessary photoresist remaining on a peripheral part of wafer becomes "refuse" to reduce the yield poses significant problems particularly in view of the recent trend for higher functional level and finer pattern in Integrated Circuit. So, for removing the unnecessary photoresist remaining on a peripheral part of wafer, a technique of removing the photoresist by a solvent spray method is in practical use.

In this method, the solvent is sprayed on the wrong side of a peripheral part of wafer, solving and removing the unnecessary photoresist.

SUMMARY OF THE INVENTION

This invention has an object of providing a method of exposing a peripheral part of wafer to remove unnecessary photoresist, which can permit exposure of a peripheral part of wafer covering a fixed distance from the wafer edge with high accuracy and high efficiency.

In this invention, there is provided a method of exposing a peripheral part of wafer with turning a wafer on which photoresist coated, exposing a peripheral part of the wafer to light guided by optical fiber lightguide, detecting the edge of the wafer by sensor, and controlling the light emission end of the optical fiber lightguide to expose a fixed distance from the edge of the wafer according to signal from the sensor.

With the method for exposing a peripheral part of wafer according to the invention, the photoresist portion on a peripheral part of wafer covering a fixed distance from the wafer edge can be exposed with high accuracy, and also it is possible to dispense with a mechanism of centering the wafer with respect to the center of turning of the stage and mechanism of detecting, positioning and exposing the orientation flat section.

DESCRIPTION OF THE PREFERRED EMBODIMENT

This invention will be described concretely hereinafter on the basis of embodiments shown in accompanying drawings.

Figure 1:
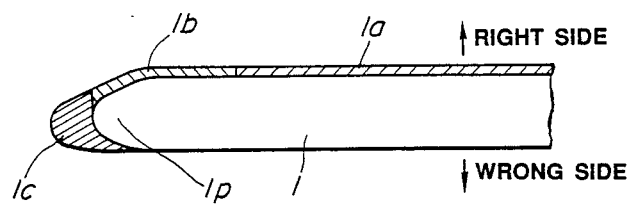
FIG. 1 is a sectional view showing photoresist coated on a peripheral part of wafer.

FIG. 1 is a cross sectional view showing photoresist coated on a peripheral part of wafer. In the Figure, reference numeral 1 designates a wafer, 1p a peripheral part of wafer 1, 1a a photoresist portion on a pattern formation part of the wafer, 1b a photoresist portion on a peripheral part 1P, and 1c a photoresist portion brought to the wrong side of the wafer 1 from the edge. The photoresist portion 1c brought to the wrong side of the wafer is not exposed in an exposure step for pattern formation, and if it is a positive type photoresist, it remains after the development.

Figure 2:
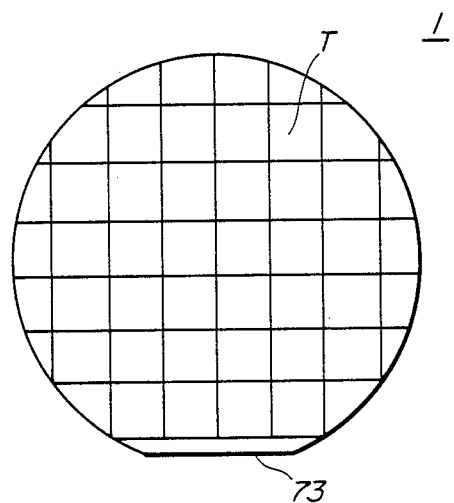
FIG. 2 is a view showing the shape of an exposed circuit pattern on the wafer.

FIG. 2 is a view showing a circuit pattern formed by exposure on the wafer. Each area labeled T corresponds to one circuit pattern. In a peripheral part of wafer, a correct circuit pattern can not be formed in many cases, or it can be formed with an inferior yield. The photoresist portion on peripheral part of wafer is substantially unnecessary in the circuit pattern formation. But, it cannot be helped that the photoresist is coated on the peripheral part of wafer in spin coating, as shown in FIG. 2.

In prior-art method, the solvent spray method, although the photoresist portion 1c as shown in FIG. 1 can be removed, the unnecessary photoresist portion 1b on the surface of the peripheral part of wafer can not be removed. Further, if it is arranged such that the solvent is sprayed on the right side of the wafer 1 for removing the unnecessary photoresist portion 1b, not only there arises the problem caused by scattering of the solvent, it is impossible to remove only the unnecessary photoresist portion 1b with high controllability and providing for a sharp borderline between the unnecessary photoresist portion 1b on the peripheral part of the wafer and photoresist portion 1a on the pattern formation part of the wafer which is necessary as a mask layer for a subsequent etching or ion implantation process.

Recently, it has been in practice to expose a peripheral part of wafer so as to remove unnecessary photoresist in the development process, in addition to the exposure for pattern formation.

Figure 3A:
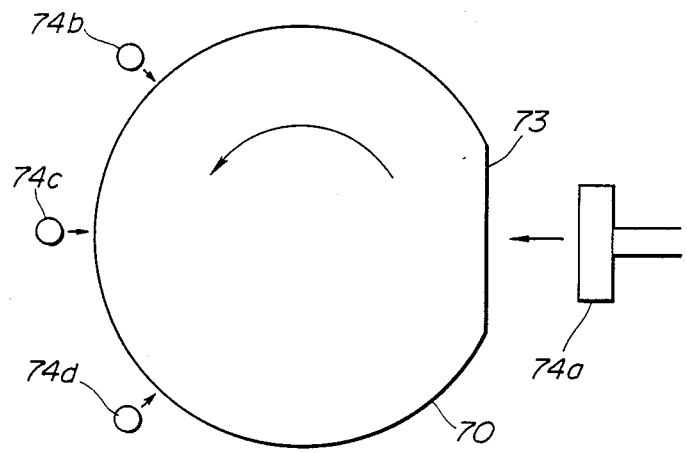
FIG. 3(a)-3(c) are views for explaining a prior art wafer edge exposure method.
Figure 3B:
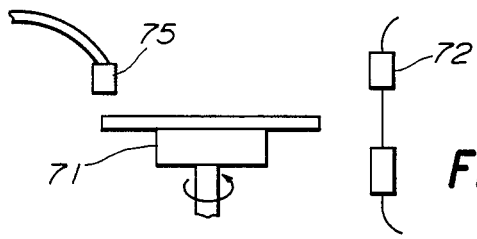
Figure 3C:
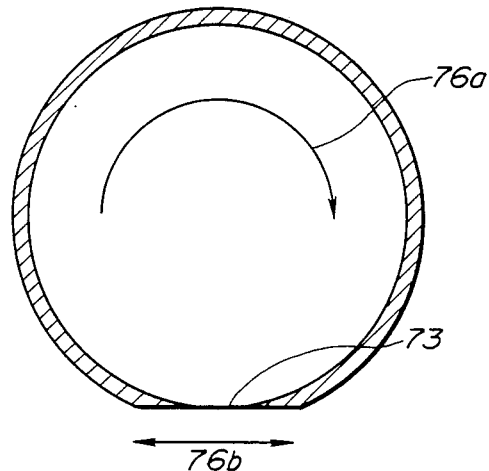

FIGS. 3(a) and 3(b) are views for explaining the prior art peripheral exposure method for such unnecessary resist removal.

A wafer 70 is set on a turning stage 71 by a conveyor system(not shown), and vacuum chucked on the stage 71. Then, the stage 71 begins to turn, and an orientation flat section 73 of the wafer 70 is detected by a sensor 72. When the orientation first section 73 is brought to a substantially predetermined position, the wafer 70 is stopped. Then, the centering of the wafer 70 and positioning of the orientation flat section 73 are done by the pushing board 74a and the pushing pins 74b to 74d are done.

Subsequent to the centering and the positioning, a peripheral part of the wafer 70 is exposed to light from a light emission end 75 of the optical fiber lightguide, while the wafer 70 turning. By the exposure of the peripheral part with the turning motion(in the direction of arrow 76a), the orientation flat section 73 is not completely exposed. Therefore, it is necessary to stop the orientation flat section 73 at a predetermined position, and move the light emission end 75 in a direction parallel to the orientation flat section 73(in the direction of arrow 76b) to effect exposure.

Although in the above exposure method the exposure is done with linear motion to the orientation flat section and turning motion to other section of peripheral part, sometimes a follow cam and a follow roller are also used to move the light emission end 75 along the peripheral part of the wafer 70.

With this peripheral exposure method, a borderline between the unnecessary photoresist portion 1b (in FIG. 1) on the peripheral part of wafer and photoresist portion 1a (FIG. 1) on the pattern formation part that is necessary as a mask layer for a subsequent ion implantation or like step can be removed sharply and with high controllability. Thus, this method is superior to the solvent spray method.

To this end, however, it is necessary to expose with high accuracy only an area covering a fixed distance from the wafer edge, which is predetermined, as unnecessary photoresist portion. In the prior art exposure method, it is necessary to set the center of wafer on the center of the turning stage, to detect and position the orientation flat section of the wafer.

The process, therefore, takes a long time. Further, it is difficult to obtain sufficient accuracy because the centering and the positioning is done mechanically. For example, if the centering could be obtained with an error of 0.2 mm, this error will appear as an exposure width error of double the value, i.e., 0.4 mm, when the exposure is done by rotating the wafer. Further, the fluctuation of diameters of wafers is directly reflected on the exposure width. Further, where wafers having different diameters or substrate having various shapes are processed, the mechanical control is very cumbersome.

Further, where the follow cam and follow roller are also used, the accuracy of exposure is determined in dependence on the accuracy of the cam. So, it is necessary to make the accuracy higher, but the accuracy has a limitation. Besides, if it is intended to increase the speed of the follow, the accuracy is deteriorated.

Accordingly this invention provides a method for exposing a peripheral part of wafer which can permit exposure of a wafer portion covering a fixed distance from the wafer edge with high accuracy and high efficiency.

Now, an embodiment of this invention will be described.

Figure 4A:
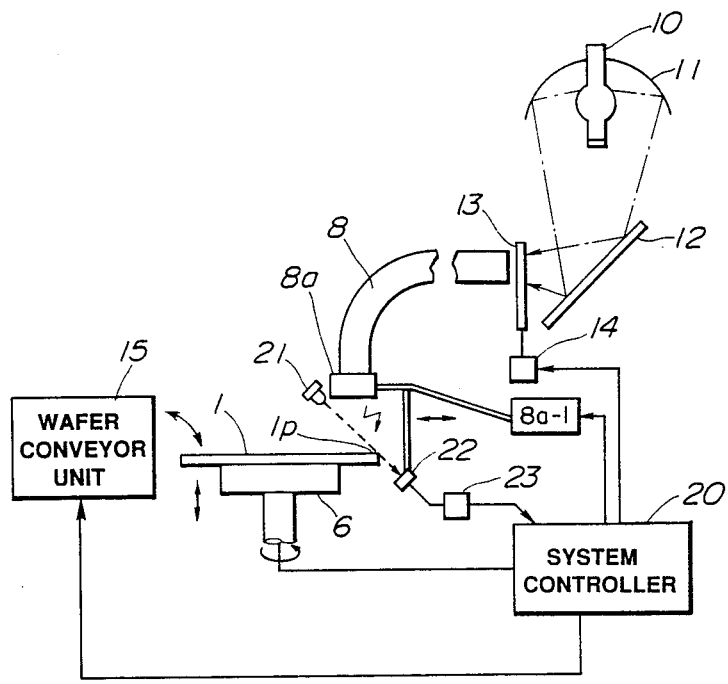
FIG. 4(a) is a schematic view for explaining one embodiment of the method of exposing a peripheral part of wafer according to the invention.
Figure 4B:
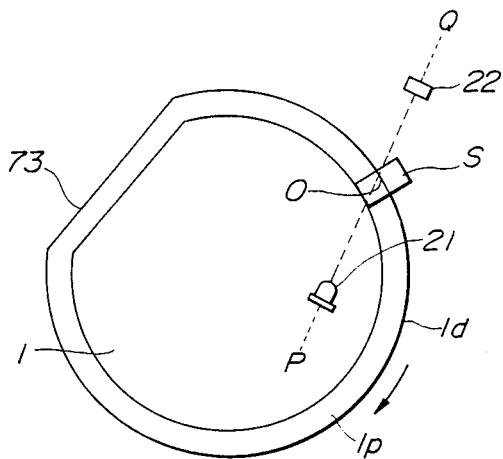
FIG. 4(b) is a view for explaining the relation between the portion of detecting wafer edge and the position of exposure.

FIG. 4(a) is a schematic view for explaining an embodiment of the method or exposing a peripheral part of wafer according to this invention, and FIG. 4(b) is a view for explaining the relation between the wafer edge detection position and exposed light pattern. Referring to FIG. 4(a) reference numeral 10 designates a mercury lamp, 11 an oval converging mirror, 12 a flat mirror, 13 a shutter, 14 a shutter actuator, e.g., a rotary solenoid, 8 an optical fiber lightguide, 8a a light emission end of the lightguide 8 provided with a focusing lens(not shown), 8a-1 a servo motor, 21 a light emitter, 22 a light receiver, 1 a wafer, 1p a peripheral part of the wafer, 6 a stage, 20 a system controller, and 15 a wafer conveyor unit. Referring to FIG. 4(b), reference numeral or symbol 1p designates a peripheral part of wafer, 1d the wafer edge, o a wafer edge detection position by a photo-sensor, and S exposed light pattern.

Referring to FIG. 4, when the wafer 1 is brought by the wafer conveyor unit to a position above the stage 6, the stage 6 is raised so that the wafer 1 is set on the stage 6. Then, the wafer 1 is fixed on the stage 6 with an operation of a vacuum chuck mechanism provided for the stage 6. Thereafter, a servo mechanism as will be described later is operated to move the light emission end 8a of the optical fiber lightguide 8 that has been at a retreated position to a position to expose the peripheral part 1p. The turning of the stage 6 is started, and the system controller 20 supplies a shutter "open" signal to the shutter actuator 14 to open the shutter 13, whereby the peripheral exposure in this embodiment of the invention is effected. As the mercury lamp 10, a superhigh pressure mercury lamp of short-arc type is used in this embodiment. Further, the arc position of the mercury lamp 10 is set to a first focal point of the oval projection mirror 11, and the light incidence surface of the optical fiber lightguide 8 is set at a second focal point of the mirror 11. Thus, light from the mercury lamp 10 is efficiently led through the lightguide 8 to expose the peripheral part 1p.

In FIG. 4(a), the light emitter 21 and light receiver 22 constitute a transmission type photo-sensor, which can detect the wafer edge ad by detecting a change in the amount of received light. Portion of the light emitter 21 and light receiver 22 are driven by the servo mortar 8a-1 in unity with light emission end 8a so that the photo-sensor can detect the wafer edge 1d at all time. The light emission end 8a is controlled by controller 20 according to the signal from the photo-sensor in order that it can expose a fixed distance from the wafer edge 1d. The predetermined width of the peripheral part 1p can be changed by changing this distance as desired. According to the invention, accurate and efficient exposure of a peripheral part of wafer can be obtained without need of any wafer centering mechanism and orientation flat section detection/positioning mechanism.

This embodiment adopts an arrangement, in which the wafer edge detection point O and exposed light pattern S overlap. However, the edge detection point O and the exposed light pattern S need not overlap, and the former may be located in front of or behind the latter in a range, in which the necessary exposure accuracy can be obtained.

In this embodiment, the exposed light pattern S has a rectangular shape because the light emission end 8a of the optical fiber lightguide has a rectangular shape. This is so because the rectangular shape make the integral of exposed light amount substantially fixed in the peripheral part 1p in the circumferential direction of the wafer 1.

Further, in this embodiment light from the light emission end 8a of the optical fiber lightguide 8 is focused by a focusing lens(not shown) on the wafer 1, so that the exposed light pattern S has a sharp contour, and photoresist can be removed sharply after the development. The photoresist portion 1c that has been brought from the edge of the wafer to the wrong side thereof as shown in FIG. 2, may be removed by spraying a solvent against the wrong side of the wafer as in the prior art, or it may be removed in the development step by providing another optical fiber lightguide exposing the wrong side of the wafer 1.

Further, while in this embodiment the sensor for detecting the edge 1d of the wafer 1 is a transmission type photosensor consisting of the light emitter 21 and light receiver 22, this is by no means limitative; for example, it is possible to use a reflection type photo-sensor or an electrostatic type sensor.

Furthermore, the scope of utility of the invention is by no means limited to semiconductor wafers of silicon, gallium arsenide, etc., and the invention is also applicable to the manufacture of surface elastic wave elements of tantalum lithiumate, tantalum niobate, etc., bubble memory elements, and other electronics elements, liquid crystal elements, magnetic recording elements and other electronics elements. Further, the wafer shape is not limited to circular shapes, but it may be rectangular.

What is claimed;

1. A method of exposing a peripheral part of wafer which comprises, turning a wafer on which photoresist coated, exposing a peripheral part of said wafer to light guided by optical fiber lightguide, detecting the edge of said wafer by sensor, and controlling the light emission end of said optical fiber lightguide to expose a fixed distance from the edge of said wafer according to signal from said sensor.

2. Said control is accomplished by servo mechanism in claim 1.

* * * * *